US008179984B2

(12) United States Patent
Luo et al.

(10) Patent No.: US 8,179,984 B2
(45) Date of Patent: May 15, 2012

(54) MULTIFUNCTIONAL TRANSMITTERS

(75) Inventors: Yan-Bin Luo, Taipei (TW); Tang-Hung Po, Pingtung County (TW)

(73) Assignee: Mediatek Inc., Hsin-Chu (TW)

( * ) Notice: Subject to any disclaimer, the term of this patent is extended or adjusted under 35 U.S.C. 154(b) by 760 days.

(21) Appl. No.: 12/269,187

(22) Filed: Nov. 12, 2008

(65) Prior Publication Data

US 2010/0118932 A1 May 13, 2010

(51) Int. Cl.
*H03M 9/00* (2006.01)

(52) U.S. Cl. ......... 375/240.28; 375/240.02; 375/240.06; 348/423.1; 348/426.1

(58) Field of Classification Search ............... 348/423.1, 348/426.1
See application file for complete search history.

(56) References Cited

U.S. PATENT DOCUMENTS 5,226,012 A * 7/1993 Amano et al. ........... 365/189.05
5,592,629 A * 1/1997 Gamble .......................... 710/51
6,865,241 B1 * 3/2005 Adkins et al. ................. 375/372
7,228,116 B2 6/2007 Cheng et al.
7,256,624 B2 8/2007 Cheng et al.
7,256,625 B2 8/2007 Liu et al.
7,310,396 B1 * 12/2007 Sabih ............................ 375/354
7,538,588 B2 5/2009 Liu et al.
7,597,881 B2 10/2009 Gruning et al.
2005/0088428 A1 * 4/2005 Liu et al. ....................... 345/204
2007/0103349 A1 * 5/2007 Liu et al. ....................... 341/101
2008/0068683 A1 * 3/2008 Kanno .......................... 358/530

FOREIGN PATENT DOCUMENTS

CN 1959801 A 5/2007
CN 1971704 5/2007

OTHER PUBLICATIONS

English abstract of CN1959801A; pub. May 9, 2007.
English language translation of abstract of CN 1971704 (published May 30, 2007).

* cited by examiner

*Primary Examiner* — Thai Tran
*Assistant Examiner* — Sunghyoun Park
(74) *Attorney, Agent, or Firm* — Thomas|Kayden

(57) ABSTRACT

Multifunctional transmitters capable of transmitting signals of different specifications in different modes are provided, in which N output units are provided and each output unit comprises a serializer and an output driver. A control unit, according to a mode selection signal, selects a first set of output units from the N output units to transmit a first video data compatible with a first transmission interface under a first transmission mode and selects a second set of output units from the first set of output units to transmit a second video data compatible with a second transmission interface which is different from the first transmission interface under a second transmission mode.

25 Claims, 5 Drawing Sheets

MULTIFUNCTIONAL TRANSMITTERS

BACKGROUND OF THE INVENTION

1. Field of the Invention

The invention relates to transmitters, and more particularly, to multifunctional transmitters capable of transmitting signals of different specifications in different modes.

2. Description of the Related Art

Recently, analog and digital type interfaces have been used together to process video signals in an LCD device. Here, the analog type interface has an advantage that it can allow a CRT (cathode ray tube) display to be directly substituted for the LCD device. Further, the digital type interface has an advantage in picture quality due to impedance matching and the like in the LCD device. The digital type interfaces for the LCD device which are widely used include a TMDS (transmission minimized differential signaling) type interface or an LVDS (low voltage differential signaling) type interface. Thus, in order to be compatible with different LCD devices, video or graphic processors used in electronic device, such as a computer or consumer product, are required to support the digital type interface outputting both a TMDS type digital video signal and an LVDS type digital video signal, or other types of digital video signals.

BRIEF SUMMARY OF THE INVENTION

Embodiments of a multifunctional transmitter are provided, in which N output units are provided and each output unit comprises a serializer and an output driver. A control unit, according to a mode selection signal, selects a first set of output units from the N output units to transmit a first video data compatible with a first transmission interface under a first transmission mode and selects a second set of output units from the first set of output units to transmit a second video data compatible with a second transmission interface which is different from the first transmission interface under a second transmission mode.

The invention also provides another embodiment of a multifunctional transmitter, in which N output units are provided and each output unit comprises a Y:1 serializer and an output driver. A control unit encodes a first video data, which is compatible with a low voltage differential signaling (LVDS) transmission interface and comprises a plurality of X-bit data, into a plurality of Y-bit first data, and then outputs the plurality of Y-bit first data to a first set of output units out of the N output units under a first transmission mode, such that the first set of output units convert the plurality of Y-bit first data into a plurality of first data steams and transmit the first data streams to a first external receiver, wherein X and Y are different.

The invention also provides an embodiment of a data transmission method, in which a first set of output units from N output units are selected to transmit a first video data, which is compatible with a first transmission interface and comprises a plurality of X-bit data under a first transmission mode, wherein the N output units each comprises a 1:Y serializer and an output driver, and X is different from Y. A second set of output units are selected from the first set of output units to transmit a second video data, which is compatible with a second transmission interface and comprises a plurality of Y-bit data under a second transmission mode, wherein the first and second transmission interfaces are different.

The invention also provides another embodiment of a data transmission method, in which a first video data, which is compatible with a low voltage differential signaling (LVDS) transmission interface and comprises a plurality of X-bit data, is encoded into a plurality of Y-bit first data under a first transmission mode. The plurality of Y-bit first data are outputted to a first set of output units out of the N output units each comprising a Y:1 serializer and an output driver during the first transmission mode, such that the first set of output units convert the plurality of Y-bit first data into a plurality of first data steams and transmit the first data streams to a first external receiver, wherein X and Y are different.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and claims to refer to particular system components. As one skilled in the art will appreciate, consumer electronic equipment manufacturers may refer to a component by different names. This document does not intend to distinguish between components that differ in name but not function.

Figure 1:
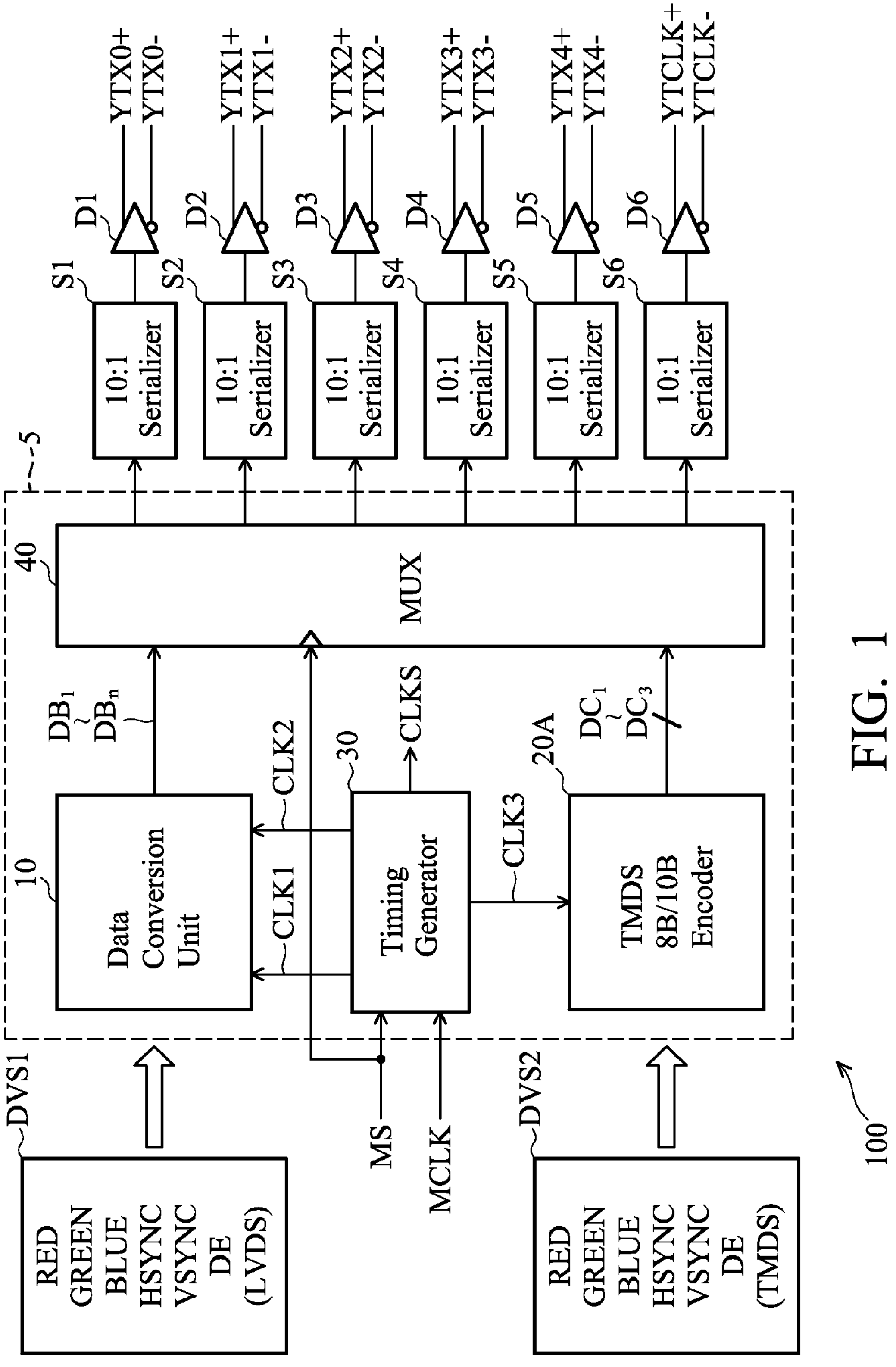
FIG. 1 shows an embodiment of a multifunctional transmitter.

FIG. 1 shows an embodiment of a multifunctional transmitter. As shown, the multifunctional transmitter 100 comprises a control unit 5 and six output units, in which each output unit comprises a 10:1 serializer and an output driver. For example, in an electronic device, the multifunctional transmitter 100 can be a portion of a graphics or video processor for transmitting video data from a data source (not shown) to a display device. The electronic device, for example, can be a mobile phone, a smart phone, a digital camera, a personal digital assistant (PDA), a notebook computer, a desktop computer, a tablet personal computer (PC) or a portable DVD player, but is not limited thereto.

The control unit 5, according to a mode selection signal MS, selects a first set of output units from the six output units to transmit a first video data compatible with a first transmission interface under a first transmission mode and selects a second set of output units from the six output units to transmit a second video data compatible with a second transmission interface. In this embodiment, the first transmission interface can be a low voltage differential signaling (LVDS) interface, and the second transmission interface can be a transmission minimized differential signaling (TMDS) interface, but is not limited thereto. For example, the second transmission interface can also be a DisplayPort interface or a V-by-One interface.

The control unit 5 comprises a data conversion unit 10, a TMDS encoder 20A, a timing generator 30 and a multiplexer 40. The data conversion unit 10 converts a first input data DVS1 from the data source into the first video data which is compatible with the LVDS transmission interface and comprises a plurality of 10-bit data $DB_1$~$DB_n$, and the TMDS encoder 20A encodes a second input data DVS2 from the data source into a TMDS video data which is compatible with the TMDS transmission interface and comprises a plurality of 10-bit data $DC_1$~$DC_m$. The timing generator 30 provides clocks to the data conversion unit 10, the TMDS encoder 20A, and the 10:1 serializers S1~S6. For example, the timing generator 30 provides clocks CLK1 and CLK2 to the data conversion unit 10 during the first transmission mode, a clock CLK3 to the TMDS encoder 20A during the second transmission mode, and a clock CLKS to the serializers S1~S6 under both the first and second transmission modes. The multiplexer 40 outputs the data from the data conversion unit 10 to the first set out of the six output units during the first transmission mode and outputs the data from the TMDS encoder 20A to the second set out of the six output units during the second transmission mode, according to the mode selection signal MS.

Figure 2:
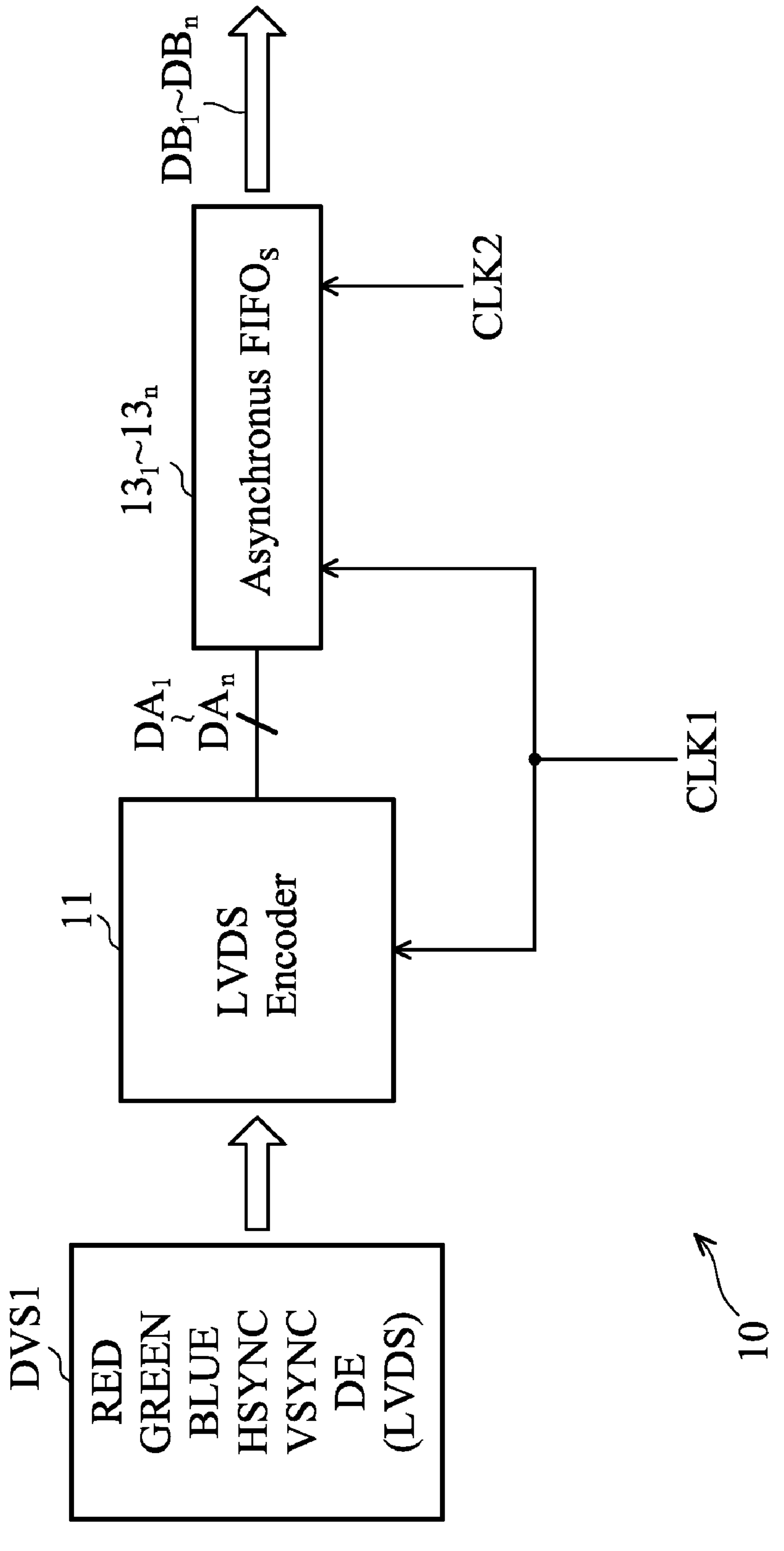
FIG. 2 shows an embodiment of a data conversion unit.

During the first transmission mode, the data conversion unit 10, according to the mode selection signal MS, encodes the first input data DVS1 from the data source into a standard LVDS video data, i.e., data which is compatible with the LVDS transmission interface and comprises a plurality of 7-bit data, such as $DA_1$~$DA_n$ shown in FIG. 2. For example, the first input data DVS1 from the data source can be composed of pixel signals RED[0:7], GREEN[0:7] and BLUE[0:7] and control signals HSYNC, VSYNC and DE, but is not limited thereto. The data conversion unit 10 encodes the pixel signals RED[0:7], GREEN[0:7] and BLUE[0:7] and the control signals HSYNC, VSYNC and DE into the standard LVDS video data comprising four sets of 7-bit data. Alternatively, the first input data DVS1 from the data source can also be composed of pixel signals RED[0:9], GREEN[0:9] and BLUE[0:9] and control signals HSYNC, VSYNC and DE. The data conversion unit 10 encodes the pixel signals RED [0:9], GREEN[0:9] and BLUE[0:9] and the control signals HSYNC, VSYNC and DE into the standard LVDS video data comprising five sets of 7-bit data.

Next, the data conversion unit 10 converts the standard LVDS video data (i.e., the plurality of 7-bit data) into the first video data which is compatible with the LVDS transmission interface and comprises the plurality of 10-bit data $DB_1$~$DB_n$. Then, the data conversion unit 10 outputs the first video data comprising the plurality of 10-bit data to the first set of output units, such that the first set of output units convert the plurality of 10-bit data into a plurality of corresponding data steams and transmit the data streams to a first external receiver (not shown).

For example, when the first input data DVS1 is composed of the pixel signal RED[0:7], GREEN[0:7] and BLUE[0:7] and the control signals HSYNC, VSYNC and DE, the data conversion unit 10 outputs the four sets of 10-bit data $DB_1$~$DB_4$ (i.e., the first video data) compatible with the LVDS transmission interface to the 10:1 serializers S1~S4 and a clock is output to the 10:1 serializer S6. Consequently, the 10:1 serializers S1~S4 and S6 convert the received data and clock into five corresponding data streams and then the output drivers D1~D4 and D6 transmit the five corresponding data steams to the first external receiver. Alternatively, when the first input data DVS1 is composed of the pixel signal RED[0:9], GREEN[0:9] and BLUE[0:9] and control signals HSYNC, VSYNC and DE, the data conversion unit 10 outputs the five sets of 10-bit data $DB_1$~$DB_5$ (i.e., the first video data) compatible with the LVDS transmission interface to the 10:1 serializers S1~S5 and a clock signal is output to the 10:1 serializer S6. Consequently, the 10:1 serializers S1~S6 convert the received data and the received clock into 6 corresponding data streams and then the output drivers D1~D6 transmit the 6 corresponding data steams to the first external receiver. In some embodiments, the clock received by the serializer S6 can be one of the clocks CLK1 and CLK2 from the conversion unit 10, but is not limited thereto.

On the contrary, during the second transmission mode, the TMDS encoder 20A encodes a second input data DVS2 from the data source into the second video data, which is compatible with the TMDS transmission interface and comprises the plurality of 10-bit data $DC_1$~$DC_4$. Then, the TMDS encoder 20A outputs the second video data comprising the plurality of 10-bit data $DC_1$~$DC_4$ to the second set of output units, such that the second set of output units convert the plurality of 10-bit data $DC_1$~$DC_4$ into a plurality of corresponding data steams and transmit the data streams to a second external receiver (not shown).

For example, the second input data DVS2 from the data source can be composed of pixel signals RED[0:7], GREEN [0:7] and BLUE[0:7] and control signals HSYNC, VSYNC and DE, but is not limited thereto. The TMDS encoder 20A encodes the pixel signals RED[0:7], GREEN[0:7] and BLUE [0:7] and the control signals HSYNC, VSYNC and DE into a standard TMDS video data (i.e., the second video data) comprising three sets of 10-bit data $DC_1$~$DC_3$. Consequently, the TMDS encoder 20A outputs the three sets of 10-bit data $DC_1$~$DC_3$ (i.e., the second video data) to the 10:1 serializers S1~S3 and a clock is output to the 10:1 serializer S6. The 10:1 serializers S1~S3 and S6 convert the received data and clock into four corresponding data streams and then the output drivers D1~D4 and D6 transmit the four corresponding data steams to the second external receiver. In some embodiments, the clock received by the serializer S6 can be the clock CLK3 from TMDS encoder 20A, but is not limited thereto.

Thus, the six output units (i.e., the 10:1 serializers S1~S6 and the output drivers D1~D6) are shared to output the first video signal compatible with the LVDS transmission interface in the first transmission mode and the second video signal compatible with the TMDS transmission in the second transmission mode.

FIG. 2 shows an embodiment of the data conversion unit. As shown, the data conversion unit 10 comprises an LVDS encoder 11 and a plurality of asynchronous FIFOs $13_1$~$13_n$. The LVDS encoder 11 encodes the first input data DVS1 into the standard video data comprising the plurality of 7-bit data $DA_1$~$DA_n$ in a clock rate of the clock CLK1, and outputs to corresponding asynchronous FIFOs $13_1$~$13_n$. For example, when the first input data DVS1 is composed of pixel signals RED[0:7], GREEN[0:7] and BLUE[0:7] and control signals HSYNC, VSYNC and DE, the LVDS encoder 11 encodes the first input data DVS1 into the standard LVDS video data comprising four sets of 7 bit data $DA_1$~$DA_4$ in the clock rate of the clock CLK1 and outputs to the asynchronous FIFOs $13_1$~$13_4$. Alternatively, when the first input data DVS1 is composed of pixel signals RED[0:9], GREEN[0:9] and BLUE[0:9] and control signals HSYNC, VSYNC and DE, the LVDS encoder 11 encodes the first input data DVS1 into the standard LVDS video data comprising five sets of 7-bit data in the clock rate of the clock CLK1 and outputs to the asynchronous FIFOs $13_1$~$13_5$. In some embodiments, the asynchronous FIFOs $13_1$~$13_n$ can be replaced with a asynchronous FIFO array, but is not limited thereto.

The plurality of asynchronous FIFOs $13_1$~$13_n$ receive and store the plurality of 7-bit data $DA_1$~$DA_n$ in the clock rate of the clock CLK1, and output the plurality of 10-bit data $DB_1$~$DB_n$ to the first set of output units in the clock rate of a clock CLK2 which is smaller than that of the clock CLK1. In the embodiment, the ratio of the clock rate of the clock CLK2 to that of the clock CLK1 is 0.7, and a product of 7 and the clock rate of the clock CLK1 is equal to that of 10 and the clock rate of the clock CLK2. Thus, the six output units (i.e., the 10:1 serializers S1~S6 and the output drivers D1~D6) are shared to output the first video signal compatible with the LVDS transmission interface in the first transmission mode and the second video signal compatible with the TMDS transmission interface in the second transmission mode.

Figure 3:
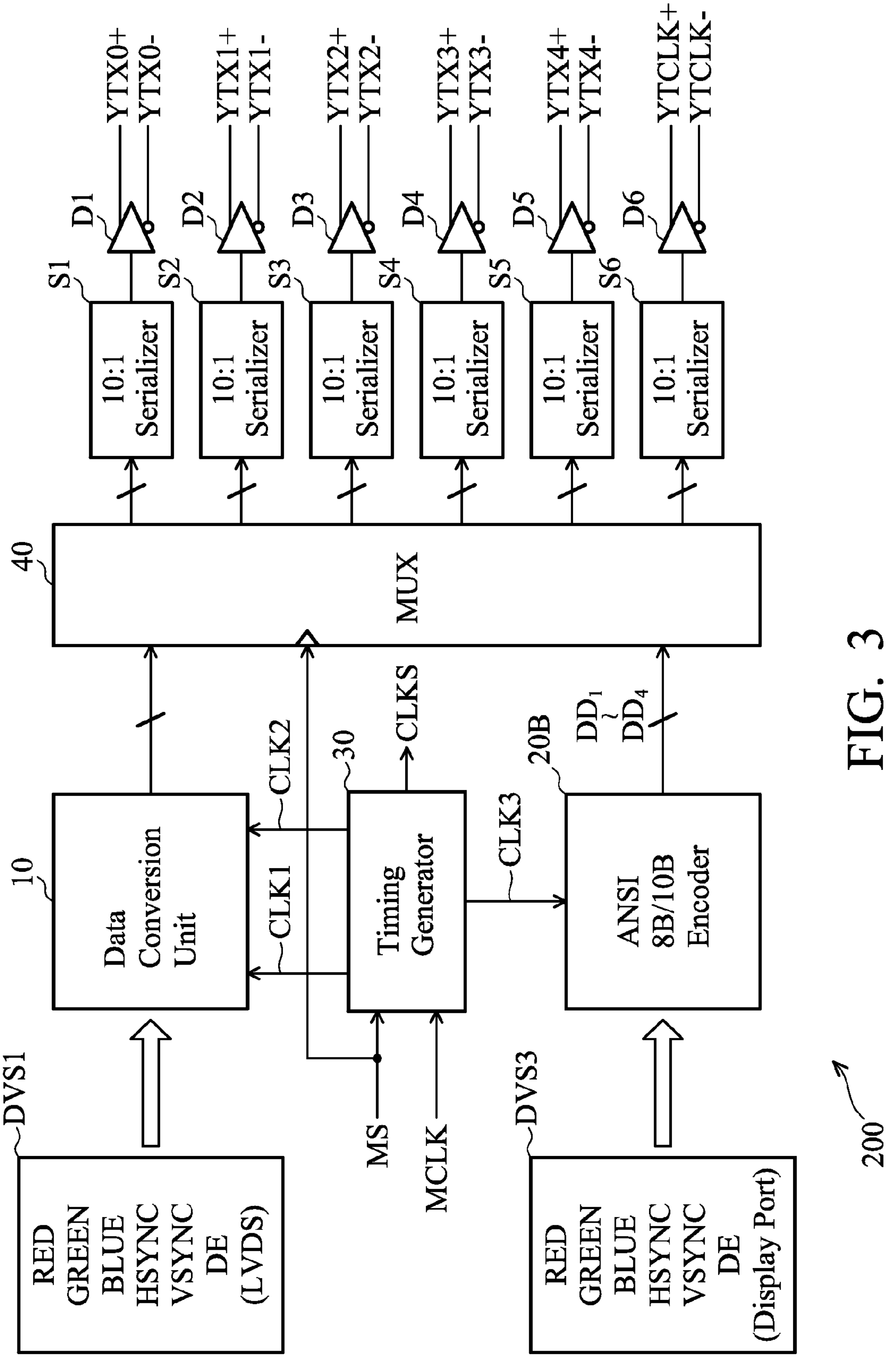
FIG. 3 shows another embodiment of a multifunctional transmitter.

FIG. 3 shows another embodiment of the multifunctional transmitter. As shown, the multifunctional transmitter 200 is similar to the multifunctional transmitter 100 shown in FIG. 1, the only difference is that the TMDS encoder 20A is replaced with an ANSI encoder 20B to encode a third input data DVS3 from the data source into a third video data which is compatible with a DisplayPort transmission interface and comprises the plurality of 10-bit data $DD_1$~$DD_4$. Then, the ANSI encoder 20B outputs the third video data comprising the plurality of 10-bit data $DD_1$~$DD_4$ to a third set of output units, such that the third set of output units convert the plurality of 10-bit data $DD_1$~$DD_4$ into a plurality of corresponding data steams and transmit the data streams to a third external receiver (not shown). For example, the ANSI encoder 20B encodes the third input data DVS3 from the data source into a standard DisplayPort video data (i.e., the third video data) comprising four sets of 10-bit data $DD_1$~$DD_4$. Consequently, the ANSI encoder 20B outputs the four sets of 10-bit data $DD_1$~$DD_4$ (i.e., the third video data) to the 10:1 serializers S1~S4. The 10:1 serializers S1~S4 convert the received data and clock into four corresponding data streams and then the output drivers D1~D4 transmit the four corresponding data steams to the third external receiver. Thus, the six output units (i.e., the 10:1 serializers S1~S6 and the output drivers D1~D6) are shared to output the first video signal compatible with the LVDS transmission interface in the first transmission mode and the fourth video signal compatible with V-by-One transmission interface in the second transmission mode.

Because the six output units (i.e., the 10:1 serializers S1~S6 and the output drivers D1~D6) are shared to transmit signals compatible with the LVDS interface during the first transmission mode and signals compatible with the TMDS transmission interface, the DisplayPort transmission interface or the V-by-One transmission interface during the second transmission mode, it does not require two sets of output units for different transmission modes and thus, a required chip area can be reduced.

Figure 4:
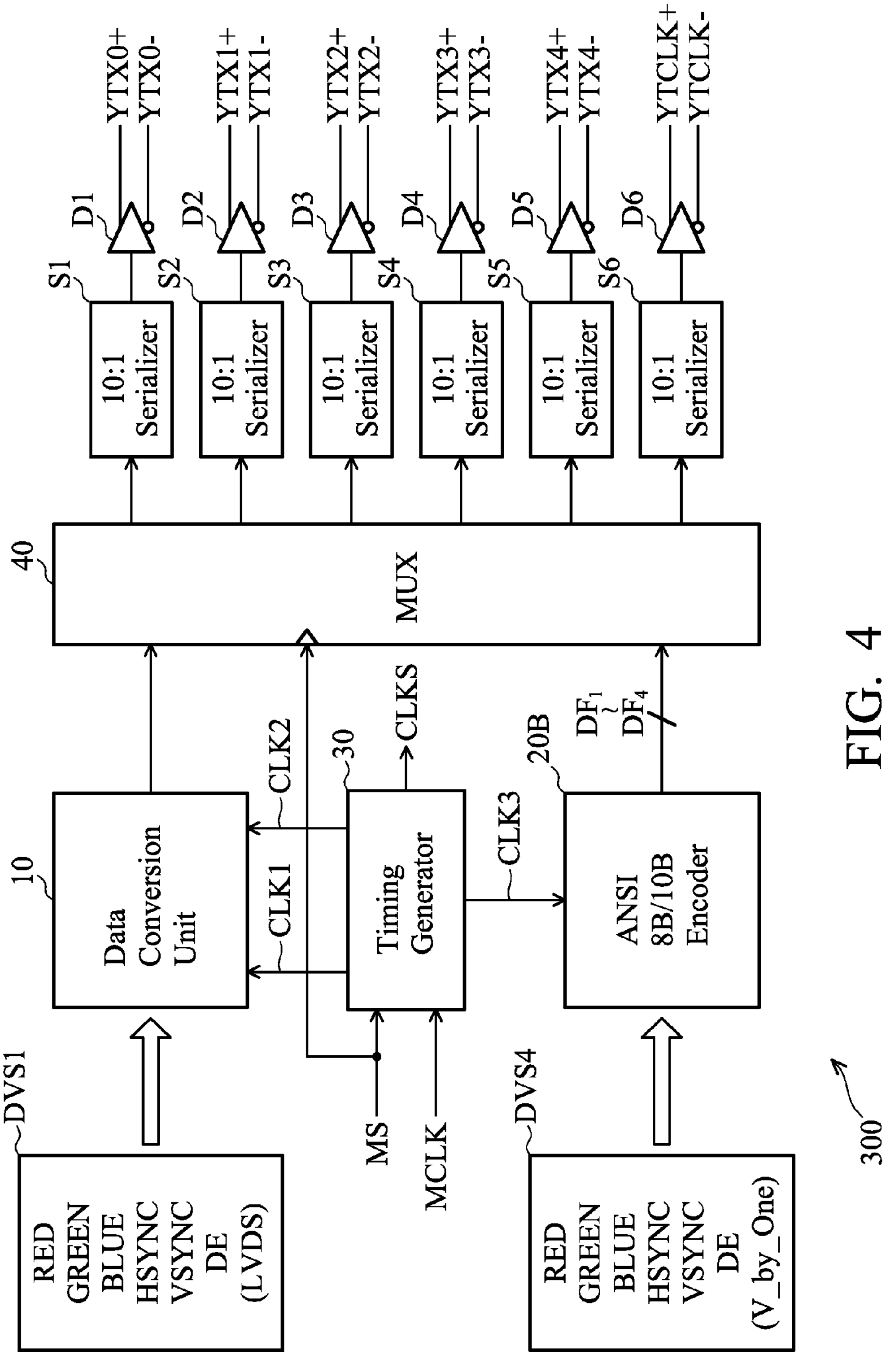
FIG. 4 shows another embodiment of a multifunctional transmitter.

FIG. 4 shows another embodiment of the multifunctional transmitter. As shown, the multifunctional transmitter 300 is similar to the multifunctional transmitter 200 shown in FIG. 3, the only difference is that the ANSI encoder 20B encodes a fourth input data DVS3 from the data source into a fourth video data which is compatible with a V-by-One transmission interface and comprises the plurality of 10-bit data $DF_1$~$DF_4$. Then, the ANSI encoder 20B outputs the fourth video data comprising the plurality of 10-bit data $DF_1$~$DF_4$ to a fourth set of output units, such that the fourth set of output units convert the plurality of 10-bit data $DF_1$~$DF_4$ into a plurality of corresponding data steams and transmit the data streams to a fourth external receiver (not shown). For example, the ANSI encoder 20B encodes fourth input data DVS4 from the data source into the fourth video data which is compatible with V-by-One transmission interface and comprising four sets of 10-bit data $DF_1$~$DF_4$. Consequently, the ANSI encoder 20B outputs the four sets of 10-bit data $DF_1$~$DF_4$ (i.e., the fourth video data) to the 10:1 serializers S1~S4. The 10:1 serializers S1~S4 convert the received data and clock into four corresponding data streams and then the output drivers D1~D4 transmit the four corresponding data steams to the fourth external receiver.

Figure 5:
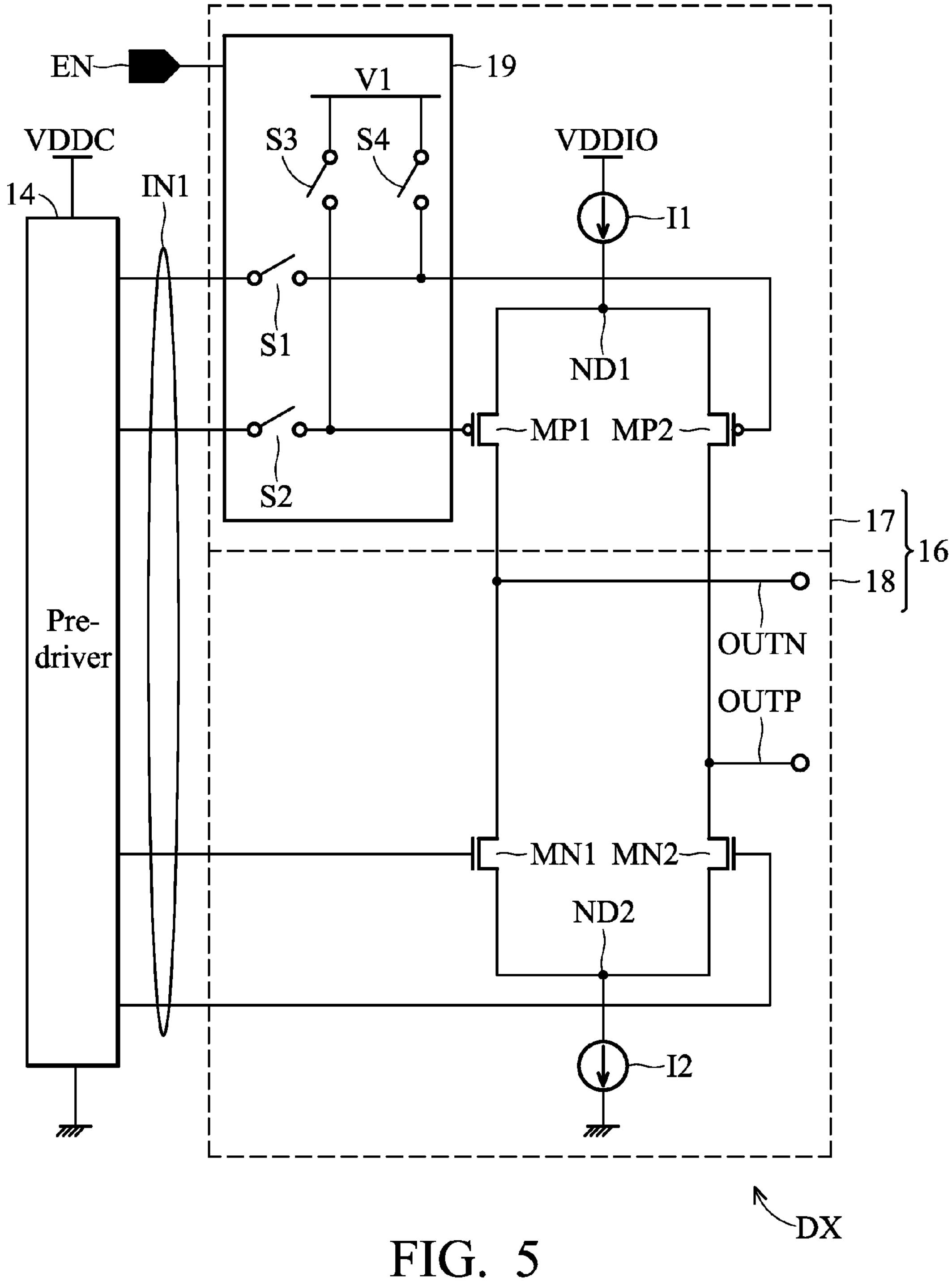
FIG. 5 shows an embodiment of an output driver.

FIG. 5 shows an embodiment of output driver. As shown, the output driver DX comprises a pre-driver 14 powered by a power voltage VDDC and a driving unit 16 powered by the power voltage VDDIO, wherein the power voltage VDDC is smaller than the power voltage VDDIO. The power voltage VDDC can, for example, be a core power voltage, such as a 1.2V, 1.0V and so on core power voltage, but is not limited thereto. The output driver DX transmits signals compatible with the LVDS transmission interface in the first transmission mode and transmits signals compatible with the second transmission interface in the second transmission mode, and the second transmission interface, for example, be a TMDS transmission interface, a DisplayPort transmission interface or a V-by-One transmission interface, but is not limited thereto.

The pre-driver 14 provides an input signal IN1 to the driving unit 16 in both the first and second transmission modes according to a signal from the front-end, the front end can, for example, be one of the serializers S1~S6. Namely, the pre-driver 14 is shared in both the first and second transmission modes. The driving unit 16, according to the input signal IN1, transmits signals compatible with the LVDS transmission interface to the transmission terminals OUTN and OUTP in the first transmission mode, and transmits signals compatible with the second transmission interface (i.e., TMDS transmission interface, DisplayPort transmission interface, or V-by-One transmission interface) to the transmission terminals OUTN and OUTP in the second transmission mode. The driving unit 16 comprises current sources I1 and I2, MOS transistors MP1, MP2, MN1 and MN2 and a switching circuit 19, in which the current sources I1 and I2 and the MOS transistors MP1, MP2, MN1 and MN2 are connected as a current steering circuit. The driving unit 16 is divided into two differential units 17 and 18, in order to transmit signals compatible with the LVDS transmission interface during the first transmission interface and signals compatible with the second transmission interface during the second transmission mode.

In the first transmission mode, the differential units 17 and 18 are both enabled to serve as a first driving unit for transmitting signals compatible with the LVDS transmission interface according to the input signal IN1 from the pre-driver 14. On the contrary, in a second transmission mode, the differential unit 17 is disabled, such that only the differential unit 18 is enabled to serve as a second driving unit to transmit signals compatible with the second transmission interface according to the input signal IN1. As shown, the current source I1, the MOS transistors MP1 and MP2 and the switching circuit 19 are regarded as a differential unit 17, and the current source I2 and the MOS transistors MN1 and MN2 are regarded as another differential unit 18.

The current source I1 is coupled between the power voltage VDDIO and a node ND1, the MOS transistor MP1 comprises a first terminal coupled to the node ND1, a second terminal coupled to the transmission terminal OUTN and a control terminal coupled to the switching circuit 19, and the MOS transistor MP2 comprises a first terminal coupled to the node ND1, a second terminal coupled to the transmission terminal OUTP and a control terminal coupled to the switching circuit 19. The MOS transistors MP1 and MP2 are implemented as a differential pair, and the control terminals of the MOS transistors MP1 and MP2 serve as input terminals of the differential pair, and the second terminals of the MOS transistors MP1 and MP2 serve as output terminals of the differential pair.

The switching circuit 19 is coupled between the control terminals of MOS transistor MP1 and MP2 and the pre-driver 14. The switching circuit 19 comprises switching devices S1, S2, S3 and S4 to selectively disable the differential unit 17 according to an enabling signal EN. The switching device S1 is coupled between the pre-driver 14 and the control terminal of the MOS transistor MP2, the switching device S2 is coupled between the pre-driver 14 and the control terminal of the MOS transistor MP1, the switching device S3 is coupled between a voltage V1 and the control terminal of the MOS transistor MP1, and the switching device S4 is the voltage V1 and the control terminal of the MOS transistor MP2. The voltage V1 can be a constant voltage capable of turning off the MOS transistors MP1 and MP2, for example, the voltage V1 can be equal to the power voltage VDDIO, but is not limited thereto.

When the enabling signal EN is activated, the switching devices S1 and S2 are turned on and the switching devices S3 and S4 are turned off, such that the MOS transistors MP1 and MP2 can be controlled by the input signal IN1. On the contrary, when the enabling signal EN is deactivated, the switching devices S1 and S2 are turned off and the switching devices S3 and S4 are turned on, such that the control terminals of the MOS transistors MP1 and MP2 are electrically isolated from the pre-driver 14 and are pulled to the voltage V1. Hence, the MOS transistors MP1 and MP2 are turned off, and the differential unit 17 is disabled accordingly.

The MOS transistor MN1 comprises a first terminal coupled to a node ND2, a second terminal coupled to the transmission terminal OUTN and a control terminal coupled to the pre-driver 14, and the MOS transistor MN2 comprises a first terminal coupled to the node ND2, a second terminal coupled to the transmission terminal OUTP and a control terminal coupled to the pre-driver 14. The MOS transistors MN1 and MN2 are implemented as another differential pair, and the control terminals of the MOS transistors MN1 and MN2 serve as input terminals of the differential pair, and the second terminals of the MOS transistors MN1 and MN2 serve as output terminals of the differential pair. The current source 12 is coupled between the node ND2 and the ground voltage.

During the first transmission mode, the enabling signal EN is activated, such that the switching circuit 19 does not pull the control terminals of the MOS transistors MP1 and MP2 to the voltage V1 and electrically connects the control terminals of the MOS transistors MP1 and MP2 to the pre-driver 14. Namely, differential units 17 and 18 are both enabled in the first transmission mode. At this time, the current steering circuit implemented by the current sources I1 and I2 and the MOS transistors MP1, MP2, MN1 and MN2 acts as a first driving unit to output signals compatible with the LVDS transmission interface according to the input signal IN1. For example, the MOS transistors MP1 and MN2 are turned on and the MOS transistors MP2 and MN1 are turned off to output a first logic state compatible with the LVDS transmission interface to the transmission terminals OUTN and OUTP according to the input signal IN1. Alternatively, the MOS transistors MP1 and MN2 are turned off and the MOS transistors MP2 and MN1 are turned on to output a second logic state compatible with the LVDS transmission interface to the transmission terminals OUTN and OUTP according to the input signal IN1.

During the second transmission mode, the enabling signal EN is deactivated, and the switching circuit 19 pulls the control terminals of the MOS transistors MP1 and MP2 to the voltage V1. Accordingly, the MOS transistors MP1 and MP2 are turned off, such that the differential unit 17 is disabled. Simultaneously, the differential unit 18 (i.e., the MOS transistors MN5 and MN6 and the current source 15) acts as a current mode logic (CML) circuit (i.e., a second driving unit) to output signals compatible with the second transmission interface according to the input signal IN1 from the pre-driver 14. In the embodiments, the second transmission interface can be a TMDS transmission interface, DisplayPort transmission interface, or V-by-One transmission interface, but is not limited thereto. For example, according to the input signal IN1, one of the MOS transistors MN1 and MN2 is turned on and the other is turned off, such that the signals compatible with the second transmission interface can be output to the transmission terminals OUTN and OUTP.

In some embodiments, the MOS transistors MN1 and MN2 can be thick-oxide native devices or low threshold voltage devices, such that operational speed of the output driver DX is not lowered by the threshold voltage of the MOS transistors MN1 and MN2. Because the entire current steering circuit (i.e., differential units 14 and 18) can output signals compatible with the LVDS interface during the first transmission mode and a portion of the current steering circuit (i.e., differential unit 18 only) can output signals compatible with the TMDS transmission interface, the DisplayPort transmission interface or the V-by-One transmission interface during the second transmission mode, it does not require two sets of output drivers and pre-drivers for different transmission modes and thus, a required chip area can be reduced. Further, because the pre-driver 14 is powered by the power voltage VDDC (i.e., core power voltage) rather than the power voltage VDDIO (i.e., I/O power voltage), it can be implemented by thin-oxide devices to further save chip area, and thus, less power consumption and high speed transmission can be obtained.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. A multifunctional transmitter, comprising:

N output units each comprising a serializer and an output driver; and a control unit, according to a mode selection signal, selecting a first set of output units from the N output units to transmit a first video data compatible with a first transmission interface under a first transmission mode and selecting a second set of output units from the first set of output units to transmit a second video data compatible with a second transmission interface which is different from the first transmission interface under a second transmission mode, wherein the first video data comprises a plurality of X-bit data, and wherein the control unit comprises a data conversion unit configured to encode a first input data into the first video data with the plurality of X-bit data, write the first video data to at least one asynchronous FIFO in a first clock rate, and output the first video data to the first set of output units from the at least one asynchronous FIFO in a second clock rate.

2. The multifunctional transmitter as claimed in claim 1, wherein the first transmission interface is a low voltage differential signaling (LVDS) interface, and the second transmission interface is one of a transmission minimized differential signaling (TMDS) interface, a DisplayPort interface or a V-by-One interface.

3. The multifunctional transmitter as claimed in claim 1, the second video data comprises a plurality of Y-bit first data, the serializers in the N output units are Y:1 serializers, and X and Y are different.

4. The multifunctional transmitter as claimed in claim 3, wherein according to the mode selection signal, the control unit encodes the plurality of X-bit data into a plurality of Y-bit second data and outputs the plurality of Y-bit second data to the first set of output units during the first transmission mode, such that the first set of output units convert the plurality of Y-bit second data into a plurality of first data steams and transmit the first data streams to a first external receiver, and the control unit outputs the plurality of Y-bit first data to the second set of output units directly during the second transmission mode, such that the second set of output units convert the plurality of Y-bit first data into a plurality of second data steams and transmit the second data streams to a second external receiver.

5. The multifunctional transmitter as claimed in claim 4, wherein the control unit comprises:

a first encoder encoding a second input data into the second video data with the plurality of Y-bit first data.

6. The multifunctional transmitter as claimed in claim 5, wherein the data conversion unit comprises:

a second encoder encoding the first input data into the first video data with the plurality of X-bit data; and the asynchronous FIFOs each storing the first video data in the first clock rate and outputting the Y-bit second data to the first set of output units from the asynchronous FIFOs in the second clock rate.

7. The multifunctional transmitter as claimed in claim 6, wherein a product of X and the first clock rate is equal to that of Y and the second clock rate.

8. The multifunctional transmitter as claimed in claim 6, wherein the control unit further comprises:

a timing generator, according to the mode selection signal, providing a first clock with the first clock rate and a second clock with the second clock rate to the data conversion unit during the first transmission mode and providing a third clock with the first clock rate to the first encoder; and a multiplexer selectively outputting the plurality of Y-bit second data to the first sets of output units and outputting the plurality of Y-bit first data to the second sets of the output units, according to the mode selection signal.

9. The multifunctional transmitter as claimed in claim 1, wherein the output drives each comprises:

a first current source coupled between a power voltage and a first node;

a first differential pair coupled between the first node and a pair of transmission terminals;

a second differential pair coupled between a second node and the pair of transmission terminals; and a second current source coupled between the second node and a ground voltage, wherein the first and second current sources and the first and second differential pairs act as a first driver for transmitting the first video data during the first transmission mode, and the first differential pair is disabled and the second differential pair and the second current source act as a second driver for transmitting the second video data during the second transmission mode.

10. A multifunctional transmitter, comprising:

N output units each comprising a Y:1 serializer and an output driver; and a control unit encoding a first video data, which is compatible with a low voltage differential signaling (LVDS) transmission interface and comprises a plurality of X-bit data, into a plurality of Y-bit first data and outputting the plurality of Y-bit first data to a first set of output units out of the N output units under a first transmission mode, such that the first set of output units convert the plurality of Y-bit first data into a plurality of first data steams and transmit the first data streams to a first external receiver, wherein X and Y are different, wherein the control unit comprises a first encoder encoding a first input data into the first video data with the plurality of X-bit data.

11. The multifunctional transmitter as claimed in claim 10, wherein the control unit comprises:

a plurality of asynchronous FIFOs receiving and storing the first video data in a first clock rate, and outputting the plurality of Y-bit first data to the first set of output units in a second clock rate.

12. The multifunctional transmitter as claimed in claim 11, wherein the first encoder encodes the first input data into the first video data with the plurality of X-bit data in the first clock rate.

13. The multifunctional transmitter as claimed in claim 11, wherein a product of X and the first clock rate is equal to that of Y and the second clock rate.

14. The multifunctional transmitter as claimed in claim 13, wherein the second set of output units are included within the first set of output units.

15. The multifunctional transmitter as claimed in claim 13, wherein the second transmission interface is one of a transmission minimized differential signaling (TMDS) interface, a DisplayPort interface or a V-by-One interface.

16. The multifunctional transmitter as claimed in claim 10, wherein the control unit further outputs a second video data, which is compatible with a second transmission interface and comprises a plurality of Y-bit second data, to a second set of output units out of N output units under a second transmission mode, such that the second set of output units convert the plurality of Y-bit second data into a plurality of second data steams and transmit the second data streams to a second external receiver, wherein the first and second transmission interfaces are different.

17. A data transmission method, comprising:

selecting a first set of output units from N output units to transmit a first video data, which is compatible with a first transmission interface and comprises a plurality of X-bit data under a first transmission mode, wherein the N output units each comprises a 1:Y serializer and an output driver, and X is different from Y, wherein the first video data comprises a plurality of X-bit data;

selecting a second set of output units from the first set of output units to transmit a second video data, which is compatible with a second transmission interface and comprises a plurality of Y-bit data under a second transmission mode, wherein the first and second transmission interfaces are different;

encoding a first input data into the first video data with the plurality of X-bit data;

writing the first video data to at least one asynchronous FIFO in a first clock rate; and outputting the first video data to the first set of output units from the at least one asynchronous FIFO in a second clock rate.

18. The data transmission method as claimed in claim 17, wherein the first transmission interface is a low voltage differential signaling (LVDS) interface, and the second transmission interface is one of a transmission minimized differential signaling (TMDS) interface, a DisplayPort interface or a V-by-One interface.

19. A data transmission method, comprising:

encoding a first video data, which is compatible with a low voltage differential signaling (LVDS) transmission interface and comprises a plurality of X-bit data, into a plurality of Y-bit first data under a first transmission mode;

outputting the plurality of Y-bit first data to a first set of output units out of N output units each comprising a Y:1 serializer and an output driver during the first transmission mode, such that the first set of output units convert the plurality of Y-bit first data into a plurality of first data steams and transmit the first data streams to a first external receiver, wherein X and Y are different; and encoding a first input data into the first video data with the plurality of X-bit data.

20. The data transmission method as claimed in claim 19, further comprising:

receiving and storing the plurality of X-bit data in a first clock rate; and outputting Y-bit second data to the first set of output units in a second clock rate.

21. The data transmission method as claimed in claim 20, wherein the first input data is encoded into the first video data with the plurality of X-bit data in the first clock rate.

22. The data transmission method as claimed in claim 20, wherein a product of X and the first clock rate is equal to that of Y and the second clock rate.

23. The data transmission method r as claimed in claim 19, further comprising outputting a second video data, which is compatible with a second transmission interface and comprises a plurality of Y-bit second data, to a second set of output units out of the N output units under a second transmission mode, such that the second set of output units convert the plurality of Y-bit second data into a plurality of second data steams and transmit the second data streams to a second external receiver, wherein the first and second transmission interfaces are different.

24. The data transmission method as claimed in claim 23, wherein the second set of output units are included within the first set of output units.

25. The data transmission method as claimed in claim 23, wherein the second transmission interface is one of a transmission minimized differential signaling (TMDS) interface, a DisplayPort interface or a V-by-One interface.

* * * * *